United States Patent [19]

Mucke

[11] 4,338,486

[45] Jul. 6, 1982

[54] HOUSING FOR ELECTRICAL AND ELECTRONIC COMPONENTS

[75] Inventor: Klaus Mucke, Landshut, Fed. Rep. of Germany

[73] Assignee: Schott Glaswerke, Mainz, Fed. Rep. of Germany

[21] Appl. No.: 44,760

[22] Filed: Jun. 1, 1979

[30] Foreign Application Priority Data

Jun. 3, 1978 [DE] Fed. Rep. of Germany ....... 2824426

[51] Int. Cl.³ .............................................. H05K 5/06
[52] U.S. Cl. ................................ 174/52 H; 228/208; 428/429
[58] Field of Search ........ 174/52 H, 137 A, 152 GM, 174/209, 211; 228/208; 428/429; 357/78

[56] References Cited

U.S. PATENT DOCUMENTS

| 2,814,572 | 11/1957 | Frye | 428/429 |
| 3,265,942 | 8/1966 | Osborne | 174/52 H |
| 3,586,926 | 6/1971 | Nakamura et al. | 357/78 |
| 3,675,310 | 7/1972 | Schwaneke et al. | 228/208 X |
| 4,177,322 | 12/1979 | Homan et al. | 174/209 X |

Primary Examiner—Arthur T. Grimley
Assistant Examiner—D. A. Tone
Attorney, Agent, or Firm—Quaintance & Murphy

[57] ABSTRACT

A housing package for the encapsulation of electrical components. The package comprises a base plate and a cap which encapsulate the electrical components. Electrical leads are lead through the base plate. The package is provided with a coating which increases the solderability of the electrical leads and increases the corrosion resistance of the housing.

1 Claim, 7 Drawing Figures

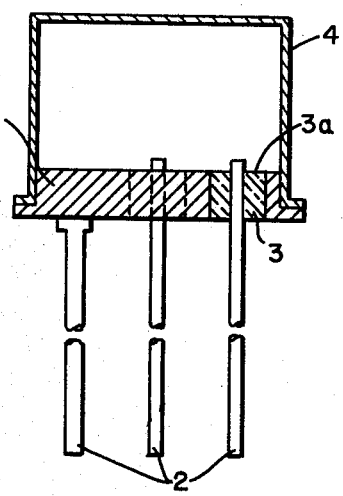
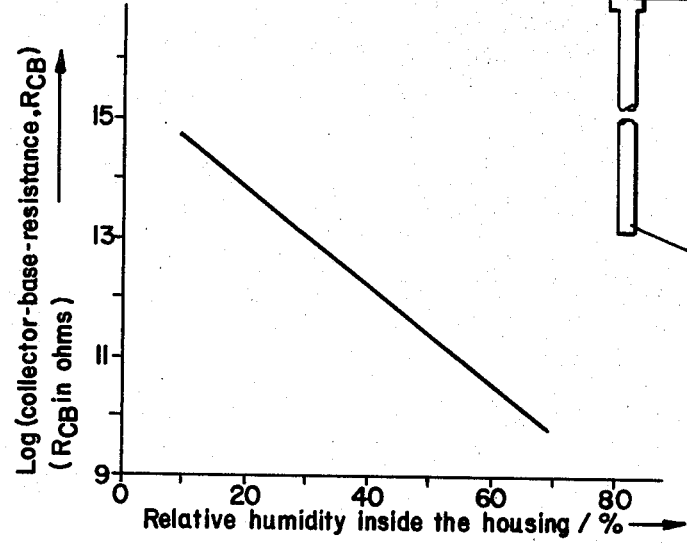
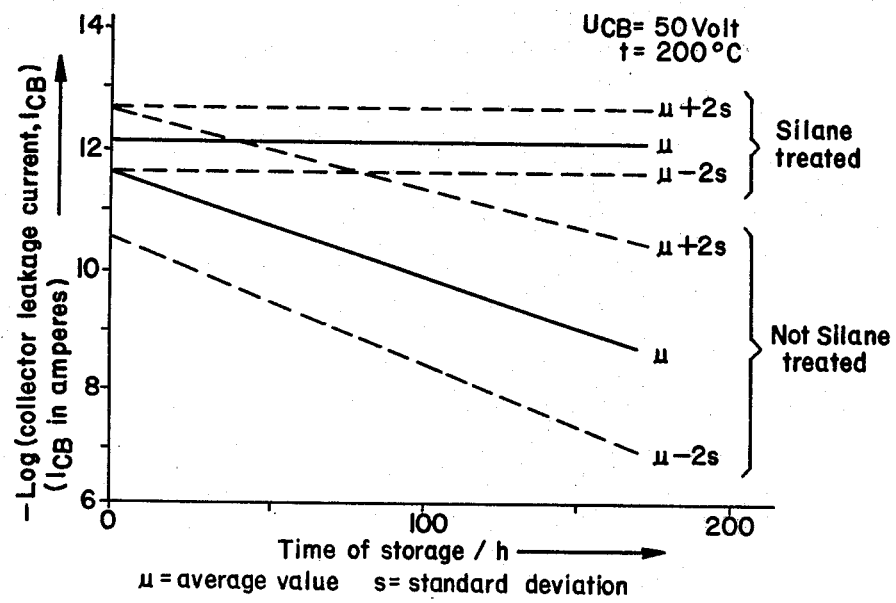

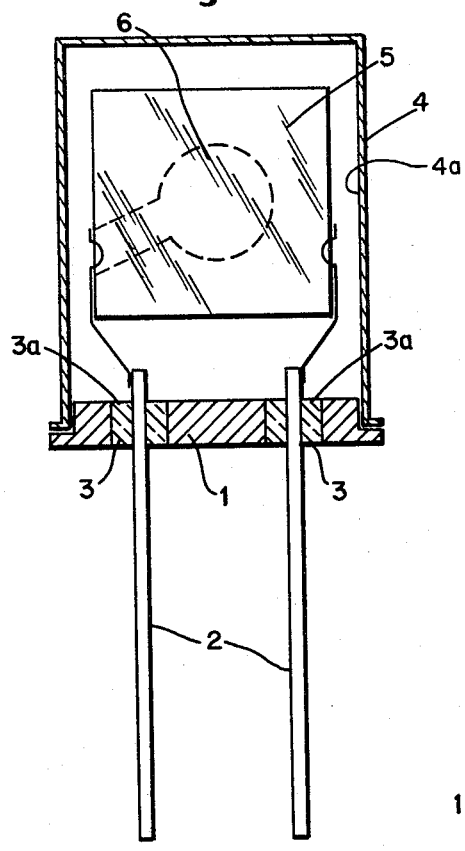
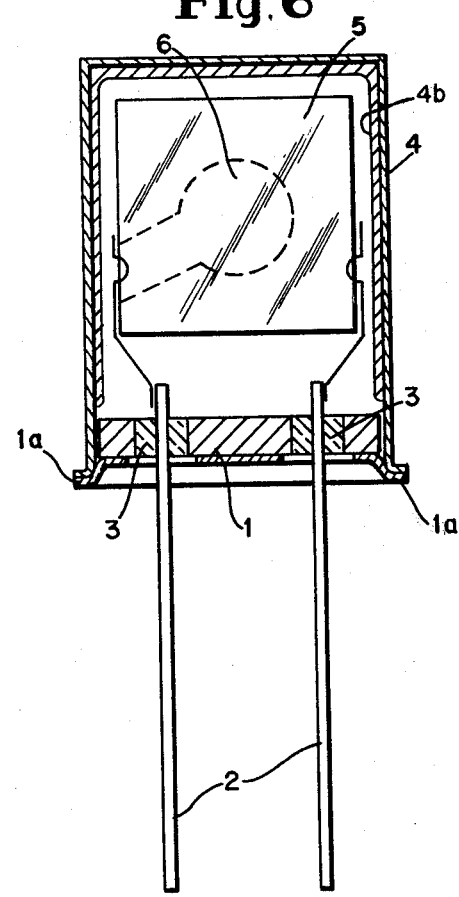

HOUSING FOR ELECTRICAL AND ELECTRONIC COMPONENTS

In order to protect them against mechanical damage or environmental influences (moisture, corrosive vapors, etc.), electronic components (transistors, thyristors, diodes, integrated circuits, hybrid circuits, etc.) and electrical components (oscillator quartzes, relays, electric switch contacts, reed switches etc.) are located in metal or part metal housings. The housings consist of a metal, glass, glass ceramic, ceramic, plastics, glass, or glass ceramic fused base-plate in which one or several electrical conductors are fitted and insulated from each other (headers, glass, glass ceramic or ceramic substrate, hybrid base-plate, plastics base etc.) with a cap made of metal, plastic, glass, glass-ceramic, ceramic or combination thereof, (cap, cover, cup, plastics encapsulation, solder glass closure, glass or glass-ceramic fused material, etc.). The base-plate and cap are secured and sealed after assembly of the electrical or electronic component by solder, welding (resistance welding, cold welding, electron beam welding, etc.) or bonding, a metal base-plate being for instance partly beaded with plastics or glass, glass ceramic or glass solder. The inside of the housing is frequently filled with a protective gas, such as dry air, dry nitrogen or nitrogen inert gas mixture (dewpoint $<0°$ C.). Components, base-plate and cap are also eventually freed of absorbed water before closure of the housing, for instance by storage at high temperature ($>50°$ C.).

For technical reasons, but also to reduce costs, steel, nickel or nickel plated steel is usually used as base material for metal base-plates and caps. In order to improve soldering ability of the component electrical leads with acid-free fluxes, for instance when securing soldered components in circuit boards, as well as to increase corrosion-resistance of the complete component, particularly the closure points of base-plate and cap, the complete component is normally covered partly or completely after closure by means of a layer of several $\mu$m of for instance nickel, tin, copper, cadmium, zinc, lead or alloys thereof.

Where components made up in housings covered in that manner are submitted to the usual testing procedures, simulating extended performance of the component (for instance test procedure MIL Standard 883B for transistors or DIN 45 103 for oscillator quartzes), or where such components are exposed to a high but still admissible service temperature over an extended period (hours, weeks) in the energised or de-energised condition, the components in these housings are compared with components in uncoated housings show a more or less greatly marked variation in electrical properties.

Collector leakage current $I_{CB}$ in transistors rises by several decade powers, the frequency $f_o$ of oscillator quartzes drops by several 100 ppm and the series resistance $R_o$ thereof increases, and in the case of electrical switch contacts, the contact resistance increases noticeably as the number of switching cycles is increased.

In all cases where such variations in electrical properties of the components exceed the admissible limits determined by the application of the component, at the expense of technical advantages in part, for instance the problem free and secure welding of base-plates and caps as well as corrosion resistance of the closures, more expensive production means are used in order to counter such variations.

As an example in the case of power diodes, the base-plate and the cap are tin-plated before closure of the housing, whereby the welding is very much more difficult and the hermeticity of the connection can only be ensured with great difficulty. Alternatively, in oscillator quartzes, only the connecting leads of the base-plate are coated by dipping in molten tin in an expensive selective tinning process. In this way, the welding of the base-plate and cap for example is admittedly facilitated and the solderability of the electrical leads is ensured, but the closure point itself, the cap and parts of the base-plate still have a higher susceptibility to corrosion.

In transistors and thyristors the base-plates are gold-plated overall to a thickness of $>0.5$ $\mu$m in order to ensure the solderability of the connecting leads. As a result of the high cost of gold, production costs for components sealed in such a manner are far above the production costs of a housing which has been completely or partially galvanized and which additionally has the advantage of a greater corrosion resistance thus allowing the use of cheaper base materials for instance for the cap (steel instead of nickel) and/or the base-plate (steel instead of NiFe or NiFeCo alloys).

These examples show that all attempts to cope with the aforesaid problems while avoiding complete coating of the closed housing, have resulted in unsatisfactory results.

The object of the present invention is a corrosion resistant housing of the aforegoing type to protect electronic and electrical components against mechanical damage or ambient influences, in which the electrical leads can be soldered with acid-free fluxes, and in which the built-in components do not undergo any variations in electrical properties for instance when stored or operated at high temperature or when proceeding with the test procedures specified for the individual components. The housing in accordance with the invention is intended to allow previously used rationalised assembly operations and equipment for the assembly and closure of the component, while utilising cheaper materials.

This aim is achieved according to the patent claims. It has been found that the above described variations in electrical properties of components are clearly caused by hydrogen and water vapour within the inside of the housing, the housing wall and electrical leads. Hydrogen is diffused in atomic form during electro tin plating and the necessary preparation processes, such as for instance during cathodic electrolytic degreasing or removal of metal oxides by pickling in acids (HCl, $H_2SO_4$, etc.), into the housing wall and the electrical leads and through the wall and leads into the inside of the housing.

The relevant contribution of individual plating processes and sundry preparation processes as well as the individual housing components such as base-plate, cap and electrical leads may vary widely in the hydrogen diffusion. As an example, the oxygen of the initially dry filler gas inside the housing, the thin oxide films on the inside of the housing, the oxide layers at the housing metal grain boundaries and the oxides of the glass, all produce water vapour particularly at higher temperatures over extended periods. Water vapour may also be present in the inside of the housing when the filler gas is insufficiently dry, or components, base-plate and/or caps are insufficiently freed of absorbed water before closing the housing.

The water vapour leading to an increase in relative humidity of the initially dry housing atmosphere (dew point>0° C.), forms a superficial gel layer on glass, resulting in increased surface conductivity in the case of base-plates with electrical leads insulated with glass and consequently to a reduction in the insulation resistance between electrical leads. In a transistor housing type TO 39, the resistance between collector and base lead $R_{CB}$ (see FIG. 1) is reduced as a result, so that a higher collector leakage current $I_{CB}$ will flow. At the same time, when storing at higher temperature a weathering of the glass surface occurs, which also results in an increased surface conductivity. When water vapour is adsorbed onto an oscillator quartz, this means an additional damping mass on the quartz, resulting in a reduced resonance frequency $f_o$ and an increased series resistance $R_o$. On electrical switch contacts oxidation products are formed on the contact surfaces as a result of the moist housing atmosphere, thus greatly increasing the contact resistance. The variations in electrical properties of components can be prevented in accordance with the invention.

BRIEF DESCRIPTION OF THE DRAWING

FIG. 1 is a graph showing the collector-base resistance as a function of humidity inside a housing.

FIG. 2 is a sectional view of a transistor housing.

FIG. 3 is a graph showing collector leakage current as a function of time in housings with and without silane treatment of the glass surfaces.

FIG. 4 is a sectional view of an oscillator quartz housing.

FIG. 6 is a sectional view of an oscillator quartz housing.

Figure 5:
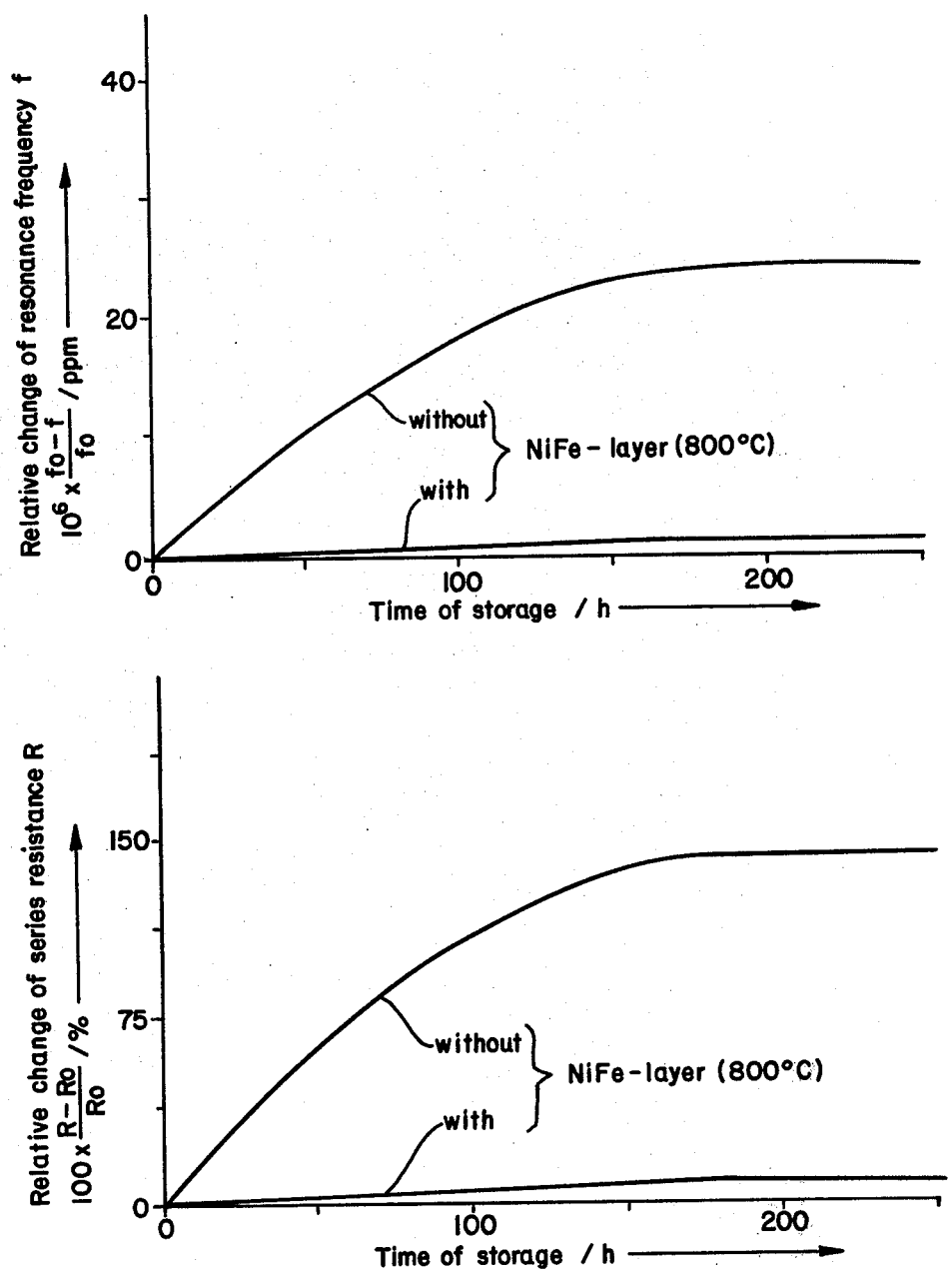
FIG. 5 comprises graphs showing change of resonance frequency and series resistance as a function of time.

The invention is described in greater detail by means of the following examples.

EXAMPLE 1

In building up transistor components (FIG. 2), base-plates (1) in the form of headers (type TO 39) are used, in which all metal parts consist of NiFeCo alloy (Vacon 10, VAC Hanau). The electrical leads (2) are insulated from each other by hard glass (3). The housing has the usual nickel cap (4), connected by resistance welding with the base-plate (1) after filling the housing with dry air (dew point $\leq -40°$ C.). The glass surfaces 3a of the base-plate 1 act as sensitive surfaces in relation to hydrogen and water vapour. Coating of these surfaces 3a with silane (for example VP 1405, Messrs. Wacker, Munich) enables the glass surfaces to be made insensitive towards the effect of hydrogen and water vapour within a great temperature range.

The collector leakage current $I_{CB}$ of transistor components hardly changes, when they are fitted to base-plates treated in that manner, the housings being completely electro-tin-plated after closure (sulphuric acid tinning bath, coating thickness 5 μM), and after storage at 200° C. On the other hand there is a marked increase in collector leakage current $I_{CB}$ for similar transistor components, where the glass surfaces have not been silane treated (FIG. 3).

EXAMPLE 2

In the production of oscillator quartzes (FIG. 4) base-plates 1 in the form of steel headers (type HC 18) are used, and these are nickel plated before fusing: (pure nickel coating thickness 4 μm). The electrical leads 2 in the form of wires consist of NiFe alloy (VACOVIT 500, VAC Hanau) and are insulated from each other with soft glass 3. The glass surfaces 3a of the base-plate 1 and the blank surfaces of the oscillation quartz 5 serve as sensitive surfaces in relation to hydrogen and water vapour, as well as quartz surfaces of the oscillation quartz 5 with fitted electrical connection contacts 6. The cap 4 consists of a fully chemically nickel plated steel cap (phosphorus containing nickel, coating thickness 5 μm) in which the nickel layer forms a nickel iron compound with the steel of the cap ($N_2$ - atmosphere, 800° C., 0.5 h). After filling the housing with dry nitrogen (dew point $\leq -40°$ C.) the cap 4 is connected by resistance welding with the base plate 1. The NiFe alloy of the electrical leads 2, and the thin NiFe layer with which the steel cap is covered, restrict the diffusion of hydrogen through the housing under electro tin plating (borofluoric tin bath, coating thickness 10 μm, that no prejudicial variations in the electrical functions of the oscillator quartz occur after storage of the component at 105° C. Where the chemical nickel layer of the steel cap is not exposed to storage at 800° C. (no formation of the NiFe layer), the aforementioned fall in resonance frequency $f_o$ and the increase in series resistance $R_o$ of the oscillator quartz (FIG. 5) are noted.

EXAMPLE 3

Figure 7:
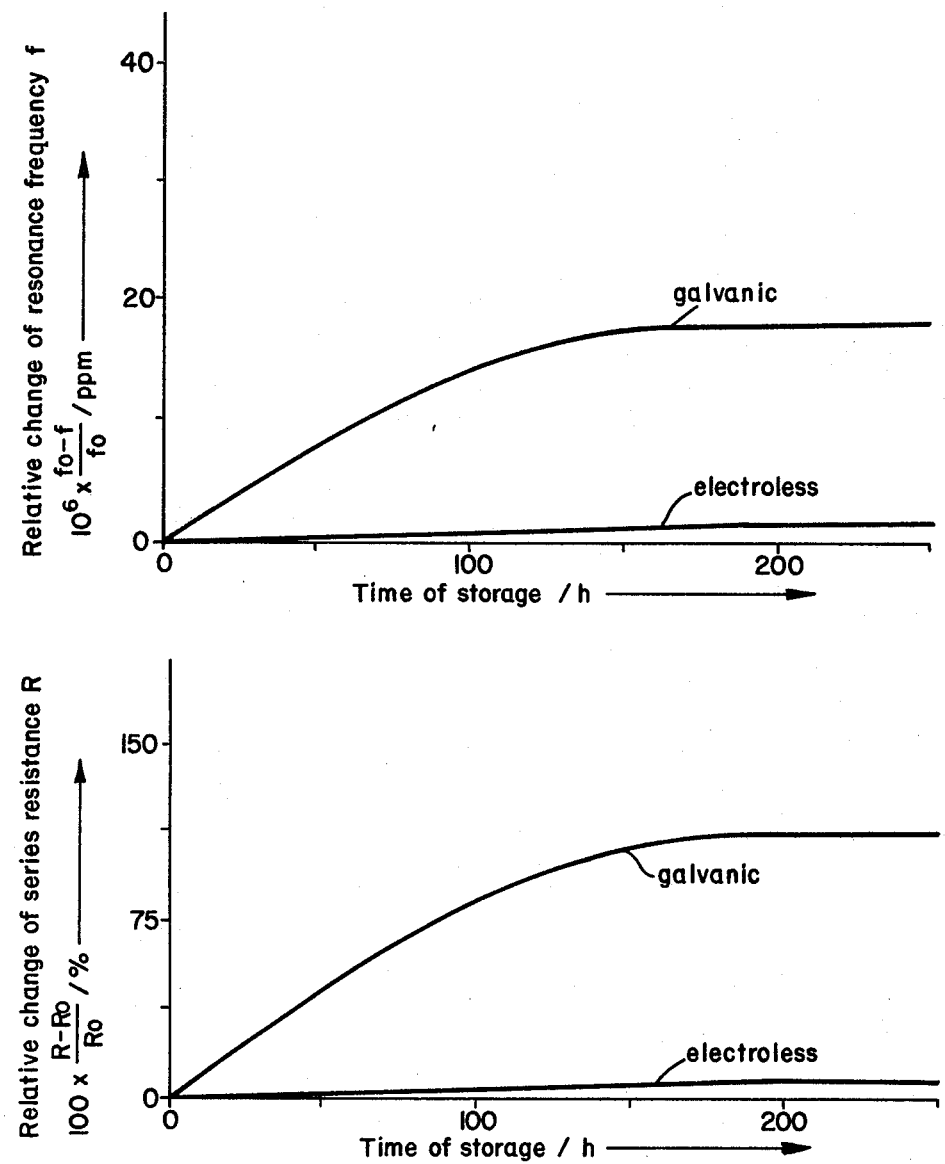
FIG. 7 comprises graphs showing change of resonance frequency and series resistance as a function of time.

In order to produce extremely temperature stable oscillator quartz (FIG. 6) base-plates 1 and caps 4 are used, which are connected together by cold welding technique after filling of the housing with dry air (dew point $\leq -40°$ C.) (type HC 43). The cap is made of copper as is the closure point 1a of the base-plate 1. The electrical leads 2 consist of copper coated wire and are insulated from each other by soft-glass 3. An electroless process (tinposit LT-27-process Messrs. Shipley, Stuttgart, coating thickness 2.0 μm) is used for tinning the housing to produce a coating 4b, with complete or nearly complete absence of hydrogen, so that the electrical properties of the oscillator quartz 5 vary very little or not at all after storage at 105° C. As against this, similar components subjected to electro tin plating (borofluoric acid tin bath, layer thickness 2 μm) show a drop in resonance frequency $f_o$ and an increase in series resistance $R_o$ (FIG. 7).

I claim:

1. A housing package for the encapsulation of electrical components comprising:
   (a) a base plate through which one or more electrical leads insulated from each other are led;
   (b) a cap attached to the base plate, the cap having walls with an inside surface and an outside surface;
   (c) electrical components which are encapsulated within the housing for protection against mechanical damage and ambient influences;
   (d) said cap being made of steel and having a coating of NiFe which restricts the diffusion of hydrogen through the cap.

* * * * *